(12) United States Patent
Sakamoto et al.

(10) Patent No.: US 8,085,256 B2
(45) Date of Patent: Dec. 27, 2011

(54) ELECTRONIC DEVICE

(75) Inventors: Mayuko Sakamoto, Nara (JP); Yoshihiro Izumi, Nara (JP); Hiromi Katoh, Nara (JP); Tomoyuki Nagai, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 633 days.

(21) Appl. No.: 11/919,331

(22) PCT Filed: Apr. 24, 2006

(86) PCT No.: PCT/JP2006/308510
§ 371 (c)(1),
(2), (4) Date: Jan. 29, 2009

(87) PCT Pub. No.: WO2006/118066
PCT Pub. Date: Nov. 9, 2006

(65) Prior Publication Data
US 2009/0135115 A1 May 28, 2009

(30) Foreign Application Priority Data
Apr. 28, 2005 (JP) .................... 2005-132939

(51) Int. Cl.
*G09G 5/00* (2006.01)

(52) U.S. Cl. .................... 345/207; 345/104; 349/104

(58) Field of Classification Search ............. 345/207, 345/76–104, 204; 349/104, 105, 110
See application file for complete search history.

(56) References Cited

U.S. PATENT DOCUMENTS 6,449,082 B1 * 9/2002 Agrawal et al. .............. 359/275
2002/0011978 A1 1/2002 Yamazaki et al.
2003/0001800 A1 1/2003 Nakajima et al.
2003/0137621 A1 7/2003 Zhang et al.
2005/0035932 A1 * 2/2005 Nishikawa et al. ............. 345/76

FOREIGN PATENT DOCUMENTS

| JP | 62-76279 | 4/1987 |
|---|---|---|
| JP | 62-76279 A | 4/1987 |
| JP | 3-35558 | 2/1991 |
| JP | 3-35558 A | 2/1991 |

(Continued)

OTHER PUBLICATIONS

Partial English translation of JP 2001-166295 published Jun. 22, 2001.

(Continued)

*Primary Examiner* — Stephen Sherman
(74) *Attorney, Agent, or Firm* — Nixon & Vanderhye P.C.

(57) ABSTRACT

An electronic device is provided which can appropriately adjust the brightness of a display apparatus in accordance with the lightness of visible light by preventing UV-light from being incident upon an optical sensor. An electronic device having, in a housing, a display apparatus (1) that includes an active matrix substrate (2) having a pixel array region (8) in which a plurality of pixels (5) are arranged and a display medium (4) provided in a gap between the active matrix substrate (2) and a counter substrate (3), includes an optical sensor (11) provided in a peripheral region (9) present in a periphery of the pixel array region (8) in the active matrix substrate (2) of a display apparatus (1), and a UV-light blocking member (70) that is provided in a portion covering the optical sensor (11) in the housing and transmits visible light and absorbs UV-light.

11 Claims, 8 Drawing Sheets

FOREIGN PATENT DOCUMENTS

| | | |
|---|---|---|
| JP | 4-174819 A | 6/1992 |
| JP | 5-241512 A | 9/1993 |
| JP | 11-98394 | 4/1999 |
| JP | 2001-166295 | 6/2001 |
| JP | 2002-62856 | 2/2002 |
| JP | 2002-175026 A | 6/2002 |
| JP | 2003-202589 | 7/2003 |

OTHER PUBLICATIONS

Partial English translation of JP 11-98394 published Apr. 9, 1999.
International Search Report for PCT/JP2006/308510 mailed May 23, 2006.

* cited by examiner

ELECTRONIC DEVICE

This application is the U.S. national phase of International Application No. PCT/JP2006/308510, filed 24 Apr. 2006, which designated the U.S. and claims priority to Japanese Patent Application No. 2005-132939, filed 28 Apr. 2005, the entire contents of each of which are hereby incorporated by reference.

TECHNICAL FIELD

The technology herein relates to an electronic device having a flat panel type display apparatus such as a liquid crystal display apparatus and an electroluminescence (EL) display apparatus, and in particular, to an electronic device having an environment sensor such as an optical sensor that detects the lightness of an ambient environment.

BACKGROUND AND SUMMARY

A flat panel type display apparatus such as a liquid crystal display apparatus has currently been incorporated in various electronic devices due to the features of thinness, light weight, and low power consumption, and further due to the technical development for the enhancement of display performance such as coloring, increase in definition, and support for moving images. Examples of the electronic device having such a flat panel type display apparatus include a wide range of information devices, TV devices, and amusement devices, such as a mobile telephone, a PDA, a DVD player, a mobile game device, a notebook PC, a PC monitor, and a TV.

In such a background, for the purpose of further enhancing visibility and reducing power consumption in a display apparatus, a display system has been proposed, which has an automatic light control function of automatically controlling the brightness of the display apparatus in accordance with the use environment, in particular, the lightness of ambient light.

For example, JP 4(1992)-174819 A and JP 5(1993)-241512 A disclose a method for providing an optical sensor that is a discrete component in the vicinity of a display apparatus, and automatically controlling the brightness of the display apparatus based on the use environment illuminance detected by the optical sensor. Consequently, the display brightness is increased in a light environment such as the daytime or the outdoor, and the display brightness is decreased in a relatively dark environment such as the nighttime and the indoor. Thus, the adjustment of a brightness (light control) can be performed automatically in accordance with the lightness of an ambient environment. In this case, a viewer of the display apparatus does not feel screen glare in a dark environment, whereby the visibility can be enhanced. Furthermore, irrespective of the lightness/darkness of a use environment, the reduction in power consumption and the increase in life of a display apparatus can be achieved, compared with a use method for keeping a display brightness to be high at all times. Furthermore, the adjustment of a brightness (light control) is performed automatically based on the detection information of an optical sensor, so that a user is not bothered.

As described above, the display system having an automatic light control function can satisfy both the satisfactory visibility and the reduction in power consumption with respect to the change in lightness of a use environment. Therefore, such a display system is particularly useful for mobile devices (a mobile telephone, a PDA, a mobile game device, etc.) which are likely to be used outdoors and require the driving of a battery.

Figure 10:
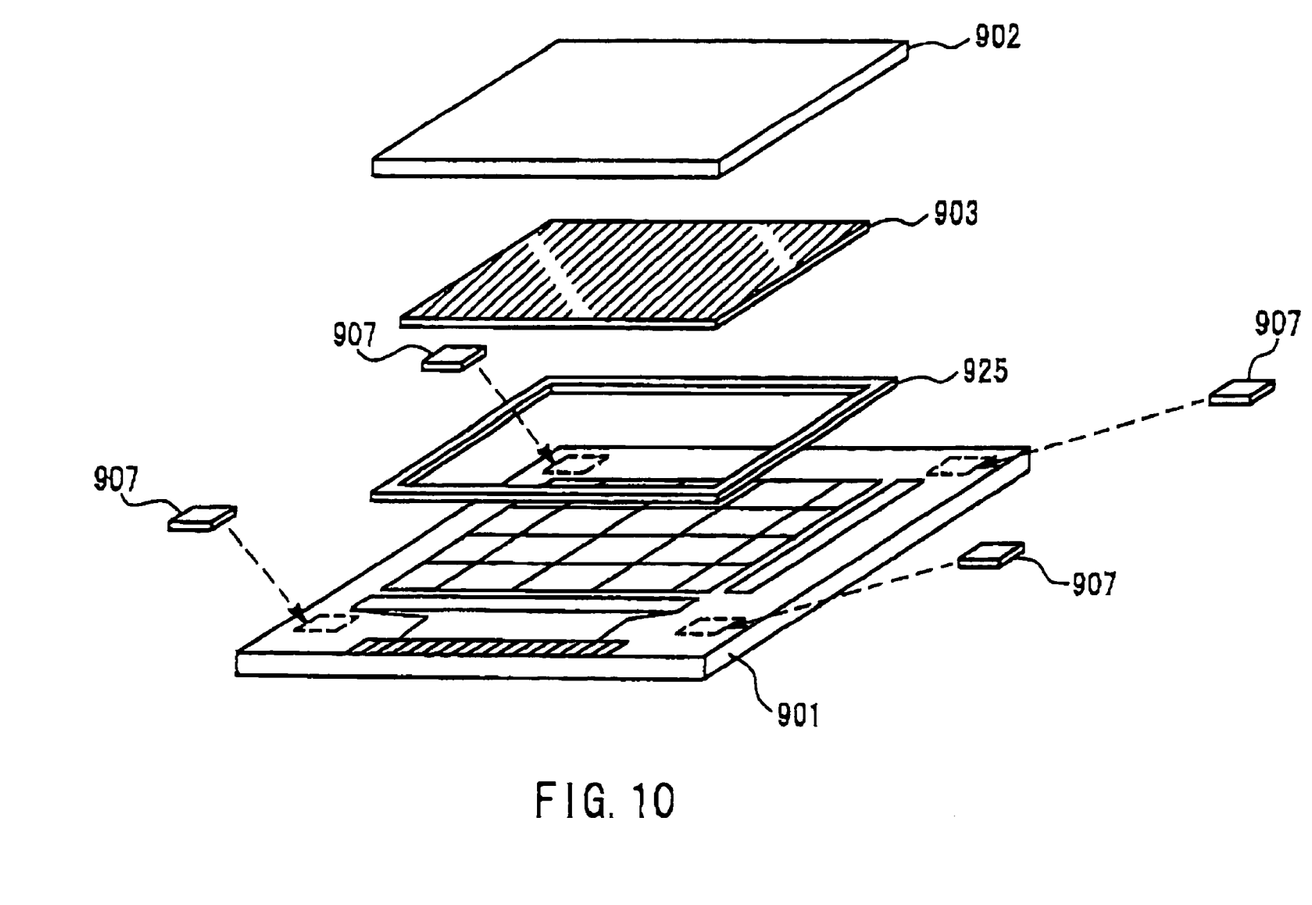
FIG. 10 is an entire configuration view of a conventional liquid crystal display apparatus disclosed by JP 2002-62856 A.
Figure 11:
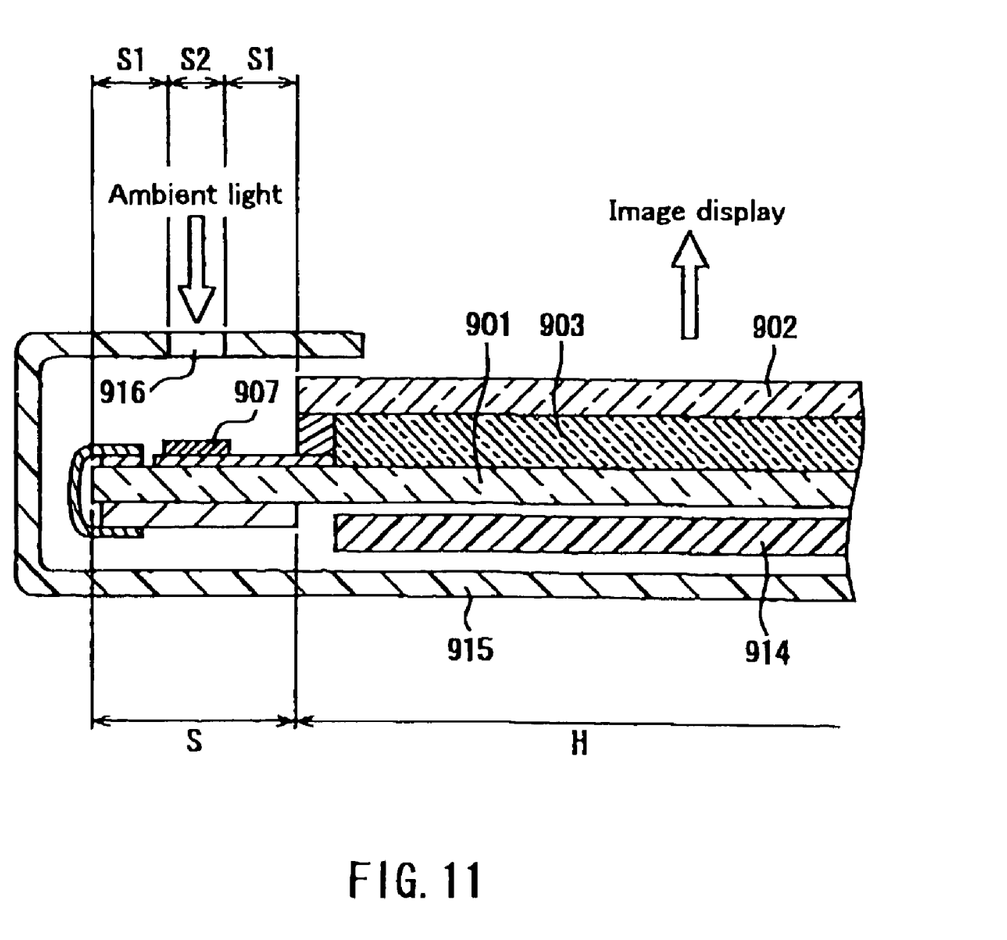
FIG. 11 is a cross-sectional view of an optical sensor mounting portion disclosed by JP 2002-62856 A.

On the other hand, JP 2002-42856 A discloses a configuration in which an optical sensor that is a discrete component is incorporated in a display apparatus. FIG. 10 is an entire configuration view of a liquid crystal display apparatus disclosed by JP 2002-62856 A, and FIG. 11 is a cross-sectional view of an optical sensor mounting portion thereof. The liquid crystal display apparatus has a configuration in which a substrate (active matrix substrate) 901 on which active elements such as thin film transistors (TFTs) are formed and a counter substrate 902 are attached to each other, and a liquid crystal layer 903 is interposed in a region surrounded by a frame-shaped sealing member 925 in a gap between the substrates. In a peripheral portion of the active matrix substrate 901, i.e., in a peripheral region S (frame region) where the counter substrate is not present, optical sensors 907 that are discrete components are provided. Light is incident upon the optical sensors 907 through openings 916 provided in a housing 915.

Thus, the configuration in which the optical sensors 907 are provided in the above peripheral region S has the following features. More specifically, in the case where a display mode of a liquid crystal display apparatus is a transmission type or a semi-transmission type, it is necessary to provide a backlight system 914 on a reverse surface of the active matrix substrate 901; however, the optical sensors 907 are provided in the above peripheral region S, so that light emitted by the backlight system 914 does not reach the optical sensors 907 directly, whereby a malfunction of the optical sensors 907 caused by the light emitted by the backlight system 914 can be minimized. Furthermore, in a normal liquid crystal display apparatus, a polarizing plate (not shown) is attached to a front side of the counter substrate 902; however, the optical sensors 907 are provided in the above peripheral region S, so that ambient light incident upon the optical sensors 907 is not blocked by the polarizing plate on the counter substrate 902, whereby a sufficient amount of ambient light can be introduced into the optical sensors. Consequently, the optical sensors 907 can obtain a high S/N.

Furthermore, recently, the technique of producing a display apparatus has advanced rapidly, and a technique of forming IC chips and various circuit elements, which are conventionally mounted in a peripheral portion of a display apparatus as discrete components, in a display apparatus (specifically on a glass substrate constituting the display apparatus) monolithically by the same process during formation of circuits and elements constituting the display apparatus has been established.

For example, JP 2002-175026 A discloses an example in which a vertical driving circuit, a horizontal driving circuit, a voltage conversion circuit, a timing generation circuit, an optical sensor circuit, and the like are formed in a peripheral region of a display region monolithically by the same process, when the display region is formed on a substrate. The monolithic formation of such discrete components in the display apparatus enables the reduction in a component count and a component mounting process, and can realize the miniaturization and reduction in cost of an electronic device incorporating the display apparatus. Needless to say, an optical sensor used for the adjustment of a brightness (light control) of a display apparatus, a circuit dedicated for an optical sensor (light amount detection circuit), and the like can also be formed monolithically in a display apparatus. JP 2002-62856 A also discloses an embodiment in which a peripheral circuit and an optical sensor are formed on a substrate constituting a display apparatus monolithically by the same process, in place of an optical sensor that is a discrete component.

As an active element used in an active matrix type display apparatus, a thin film transistor (TFT) using an amorphous Si film or a polycrystalline Si film is generally used. In the case of forming active elements and various circuit elements monolithically on the same substrate as described above, a TFT using a polycrystalline Si film is mainly used.

Figure 12:
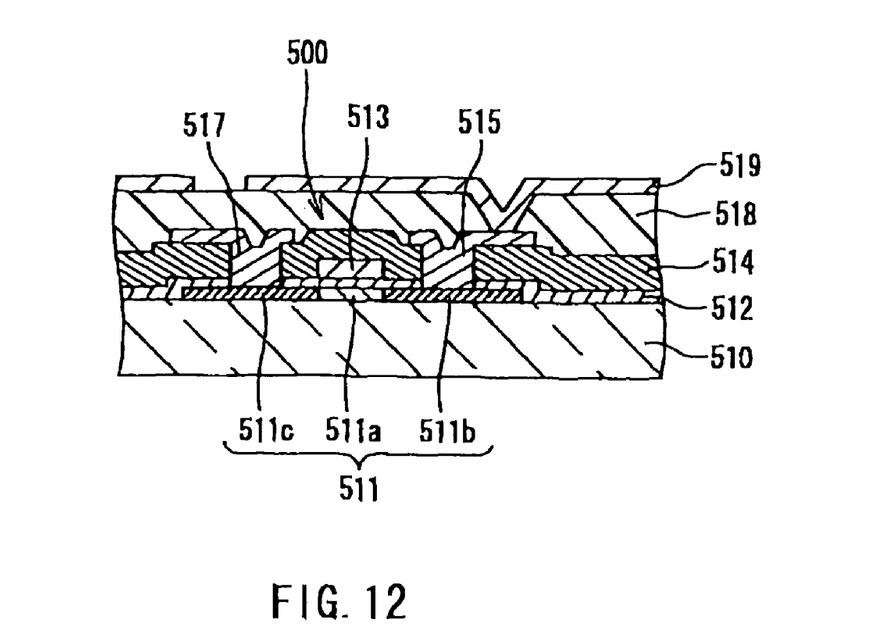
FIG. 12 is a cross-sectional configuration view of a conventional TFT formed in a pixel array region of an active matrix substrate.

Referring to FIG. 12, the configuration of a TFT having a polycrystalline Si film as a semiconductor layer, formed on each pixel of a pixel array region (display region) will be described. The configuration of a TFT described herein is called a "top gate structure" or a "forward stagger structure", and has a gate electrode in an upper layer of a semiconductor film (polycrystalline Si film) to be a channel.

A TFT 500 includes a polycrystalline Si film 511 formed on a glass substrate 510, a gate insulation film 512 formed so as to cover the polycrystalline Si film, a gate electrode 513 formed on the gate insulation film 512, and a first interlayer insulation film 514 formed so as to cover the gate electrode 513. A source electrode 517 formed on the first interlayer insulation film 514 is electrically connected to a source region 511c of a semiconductor film via a contact hole passing through the first interlayer insulation film 514 and the gate insulation film 512. Similarly, a drain electrode 515 formed on the first interlayer insulation film 514 is electrically connected to a drain region 511b of a semiconductor film via a contact hole passing through the first interlayer insulation film 514 and the gate insulation film 512. Furthermore, a second interlayer insulation film 518 is formed so as to cover them.

In such a configuration, a region of the semiconductor film overlapping the gate electrode functions as a channel region 511a. Furthermore, regions of the semiconductor film other than the channel region 511a are doped with impurities in a high concentration, and function as the source region 511c and the drain region 511b.

Although not shown, in order to prevent the degradation in electric characteristics caused by hot carriers, a lightly doped drain (LDD) region doped with impurities in a low concentration is formed on a channel region side of the source region 511c and on a channel region side of the drain region 511b.

Furthermore, a pixel electrode 519 for supplying an electric signal to a display medium to be driven is formed in an upper layer of the second interlayer insulation film 518. The pixel electrode 519 is electrically connected to the drain electrode 515 via a contact hole provided in the second interlayer insulation film 518. The pixel electrode 519 is generally required to be flat in most cases, and the second interlayer insulation film 518 present in a lower layer of the pixel electrode 591 is required to have a function as a flattening film. Therefore, it is preferred that an organic film (thickness: 2 to 3 μm) made of acrylic resin is used for the second interlayer insulation film. Furthermore, for the purpose of forming a contact hole in the TFT 500 and taking out an electrode in a peripheral region, the second interlayer insulation film 518 is required to have patterning performance, and generally, an organic film having photosensitivity is used in most cases.

On the other hand, in the case where an optical sensor for detecting the lightness of ambient light is formed monolithically in a peripheral region of a display apparatus with a TFT having the above configuration in a display region, if an attempt is made so as to minimize the increase in a production process, the element configuration of the optical sensor is limited.

Figure 13:
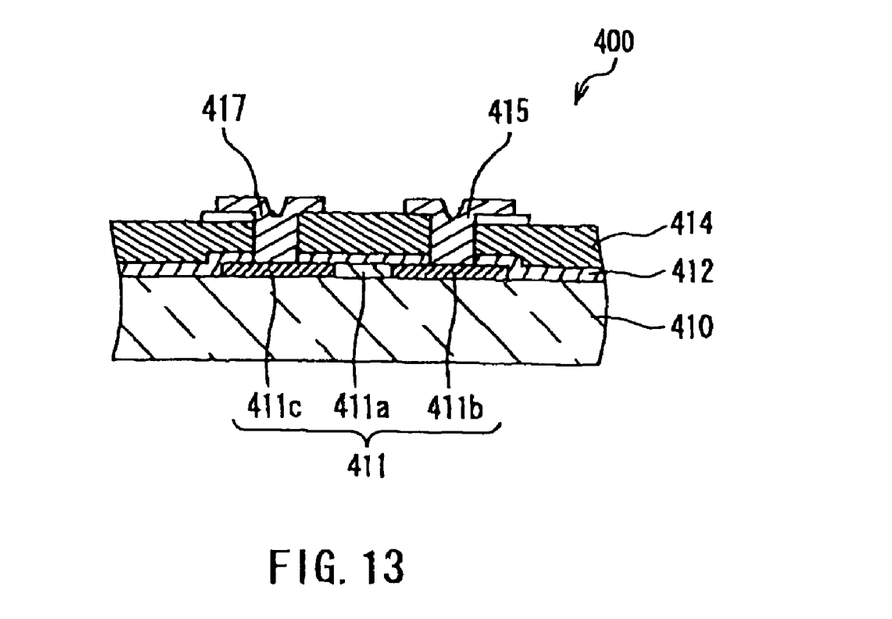
FIG. 13 is an element configuration cross-sectional view of a conventional optical sensor.

FIG. 13 is a view showing an element configuration cross-section of an optical sensor 400 satisfying these conditions. A semiconductor film 411 constituting the optical sensor is formed on a glass substrate 410, and a doped region (a p-region 411c or an n-region 411b) of the semiconductor film 411 is formed in a lateral direction (plane direction) instead of a vertical direction (stack direction) with respect to a non-doped region (an i-region 411a). Generally, a configuration having a PIN junction in the lateral direction (plane direction) with respect to a formation surface is called a PIN-type photodiode with a lateral structure.

Each member constituting the optical sensor 400 is formed by the same process as that of each member constituting the TFT shown in FIG. 12. For example, an insulation film 412 formed of the same material and by the same process as those of the gate insulation film 512 is formed in an upper layer of the semiconductor film 411, and a p-side electrode 417 formed of the same material and by the same process as those of the source electrode 517 and an n-side electrode 415 formed of the same material and by the same process as those of the drain electrode 515 are formed in an upper layer of the first interlayer insulation film 414.

The optical sensor 400 shown in FIG. 13 can be used in place of the optical sensor 907 (a discrete component provided in a peripheral region) of a conventional display apparatus shown in FIG. 10, and can reduce a component count and a component mounting process, when the display apparatus shown in FIG. 10 is incorporated in an electronic device.

However, it was clarified that if an attempt is made so as to realize a display apparatus by forming the above-mentioned optical sensor shown in FIG. 13 in a peripheral region of an active matrix substrate, the following problems occur.

An active matrix substrate constituting a display apparatus is roughly divided into a display region (H shown in FIG. 11) and a peripheral region (frame region) (S shown in FIG. 11), and the latter peripheral region (S) can be further divided into a light shielding region (S1) shielded against light by the housing, and a non-light shielding region (S2) that is positioned in an opening (for example, corresponding to the opening 916 in FIG. 11) provided in the housing and receiving incidence of ambient light. The above-mentioned optical sensor needs to receive ambient light, so that the optical sensor needs to be placed in the non-light shielding region (S2) on the active matrix substrate.

With the above configuration, light with an entire wavelength contained in ambient light (solar light) is incident upon an optical sensor through the non-light shielding region (S2). A photodiode using the above-mentioned silicon thin film semiconductor is used preferably as an optical sensor. Such a photodiode has characteristics in which the sensitivity with respect to light in a short-wavelength region, i.e., UV-light increases relatively when the light with the entire wavelength is incident. Therefore, in spite of the fact that the adjustment of a brightness of a display apparatus originally needs to be performed in accordance with the lightness of visible light, there arises a problem that the optical sensor reacts with the intensity of UV-light, which makes it impossible to adjust a brightness appropriately.

In view of the above problems, an aspect of an example embodiment presented herein is to provide an electronic device that detects the lightness of visible light with high precision by preventing UV-light from being incident upon an optical sensor, and for example, can appropriately adjust the brightness of a display apparatus.

In order to solve the above problems, an electronic device according to the present embodiment including an active matrix substrate having a pixel array region in which a plurality of pixels are arranged and a display medium provided on the active matrix substrate, includes: an optical sensor provided in a peripheral region present in a periphery of the pixel array region in the active matrix substrate of the display apparatus; and a UV-light blocking member that is provided in a portion covering the optical sensor, and that transmits visible light and absorbs UV-light.

According to the above configuration, the UV-light blocking member is provided in a portion covering the optical sensor, whereby UV-light contained in ambient light can be prevented from reaching the optical sensor. Thus, the influence of UV-light on the detection precision of the optical sensor can be suppressed, and the lightness of visible light can be detected with high precision. Consequently, the brightness of the display apparatus can be adjusted appropriately so as to be matched with the visual characteristics of a human, for example, in accordance with the output results of the optical sensor.

In the electronic device according to the present embodiment, it is preferred that the UV-light blocking member attenuates a transmittance of UV-light contained in ambient light to 50% or less. This is because the adverse influence on the detection precision of the optical sensor caused by UV-light can be suppressed effectively.

In the electronic device according to the present embodiment, it is preferred that the UV-light blocking member is an acrylic plate.

It is preferred that the electronic device according to the present embodiment further includes a touch panel stacked on the display apparatus, and the touch panel includes the UV-light blocking member. This is because the constituent element of the touch panel also functions as the UV-light blocking member, whereby the influence of UV-light on the detection precision of the optical sensor can be suppressed without increasing a component count.

In the electronic device according to the present embodiment, it is preferred that at least a part of a constituent member of the optical sensor is produced by the same process as that of a constituent member of the active element. This is because a production process is simplified, which reduces a cost.

In the electronic device according to the present embodiment, it is preferred that the optical sensor is formed on a principal plane of the active matrix substrate monolithically. Herein, the optical sensor being "formed monolithically" on the active matrix substrate does not include the optical sensor being mounted on the active matrix substrate as a discrete component. More specifically, the optical sensor being "formed monolithically" on the active matrix substrate means that the optical sensor is formed on a principal plane of the active matrix substrate through the step in which the active matrix substrate is directly subjected to a physical and/or chemical process such as film formation treatment and etching treatment.

In the electronic device according to the present embodiment, it is preferred that in the pixel array region of the active matrix substrate, a plurality of electrode wires, a plurality of active elements, an interlayer insulation film provided in an upper layer of the plurality of electrode wires and the plurality of active elements, and a plurality of pixel electrodes formed on the interlayer insulation film are provided, and a transparent insulation layer made of the same material as that of the interlayer insulation film in the pixel array region is provided in an upper layer of the optical sensor. This is because the transparent insulation layer protects the optical sensor and the electrodes from outside air.

In the above electronic device, it is preferred that the interlayer insulation film and the transparent insulation layer are formed by the same process. This is because it is not necessary to increase the number of production steps, and the production cost of a display apparatus can be suppressed.

Furthermore, it is preferred that the electronic device according to the present embodiment further includes a transparent conductive layer made of the same material as that of the pixel electrode in an upper layer of the transparent insulation layer, and the transparent conductive layer is insulated from the pixel electrode in the pixel array region and is connected to a fixed potential. This is because the transparent conductive layer functions as an electromagnetic shield of the optical sensor to enhance the resistance to an electromagnetic noise of the optical sensor and an S/N ratio, which enables sensing with higher precision to be performed and can prevent the malfunction of peripheral circuits.

In the above-mentioned electronic device, it is preferred that the pixel electrode and the transparent conductive layer are formed by the same process. This is because the production cost of the display apparatus can be suppressed without increasing the number of production steps.

In the above-mentioned electronic device, for example, a thin film transistor can be used as the above-mentioned active element, and a photodiode having a lateral structure can be used as the environment sensor.

It is preferred that the electronic device according to the present embodiment further includes a control circuit that controls a display brightness in accordance with lightness information of ambient light detected by the optical sensor. The control of the display brightness can be realized when the control circuit controls the brightness of a backlight system, for example, in the case of the display apparatus with the backlight system. Furthermore, in the case where the display apparatus is a self-light emitting element, the control of the display brightness can be realized when the control circuit controls an emission brightness. Thus, by controlling the display brightness so as to obtain a necessary and sufficient brightness in accordance with the lightness of the circumstance, an electronic device that reduces power consumption and realizes an easy-to-see display can be provided. The electronic device can satisfy both the satisfactory visibility and the reduction in power consumption with respect to the change in lightness of a use environment, so that it is particularly useful as a mobile device which is likely to be used outdoors and requires the driving of a battery. Specific examples of such a mobile device are not limited to the application of the present invention, and include, for example, an information terminal such as a mobile telephone and a PDA, a mobile game device, a portable music player, a digital camera, and a video camera.

As described above, according to the present invention, an electric device can be provided, which detects the lightness of visible light with high precision by preventing UV-light from being incident upon an optical sensor, and for example, can appropriately adjust the brightness of a display apparatus.

DETAILED DESCRIPTION

Hereinafter, an electronic device according to an embodiment will be described with reference to the drawings. In the present embodiment, although a liquid crystal display apparatus is described as an example of a display apparatus provided in an electronic device, the present embodiment is also applicable to an electronic device having a display apparatus other than a liquid crystal display apparatus.

First Embodiment

Figure 1:
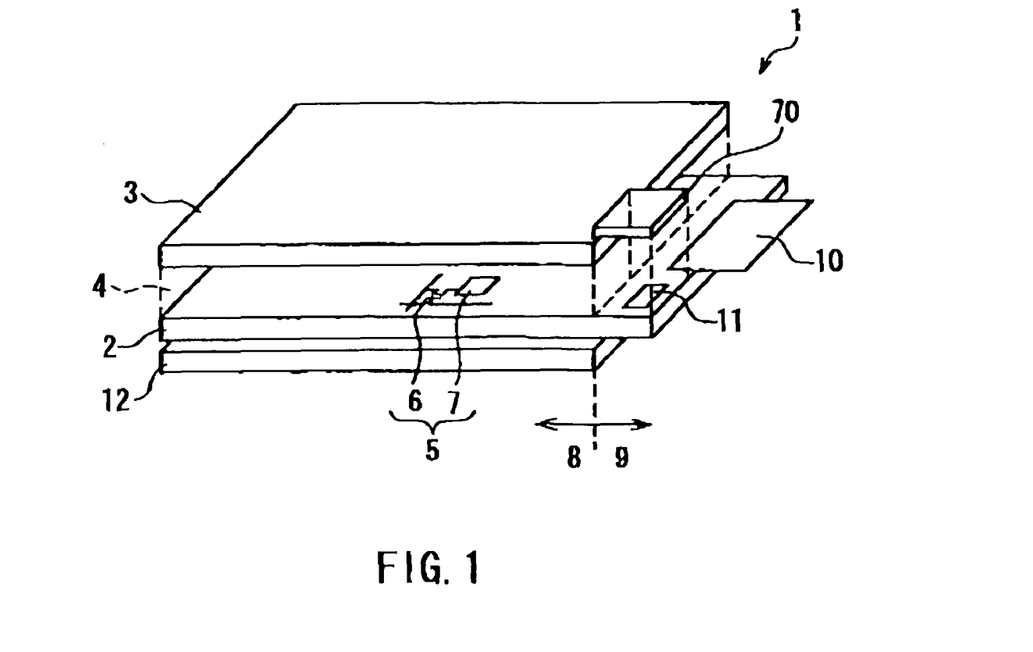
FIG. 1 is a perspective view showing an entire configuration of a display apparatus provided in an electronic device according to First Embodiment.

FIG. 1 is a schematic configuration view of a display apparatus 1 provided in an electronic device according to First Embodiment. The display apparatus 1 includes an active matrix substrate 2 on which a number of pixels are arranged in a matrix, and a counter substrate 3 placed so as to be opposed to the active matrix substrate 2, and liquid crystal that is a display medium 4 is interposed in a gap between the substrates. The active matrix substrate 2 and the counter substrate 3 are bonded to each other with a frame-shaped seal resin (not shown) along an outer periphery of the counter substrate 3.

In each pixel 5 of the active matrix substrate 2, a thin film transistor (TFT) 6 and a pixel electrode 7 for driving the display medium 4 are formed. The counter substrate 3 is provided with a counter electrode (not shown) and a color filter (not shown).

The active matrix substrate 2 includes a region (pixel array region) 8 in which the pixels 5 are arranged, and a peripheral region 9 close to the pixel array region, and the counter substrate 3 is provided so as to cover the pixel array region 8 and to expose a part of the peripheral region 9.

In the peripheral region 9 of the active matrix substrate 2, an FPC 10 for connecting an external driving circuit to the display apparatus is mounted via a terminal 38 (see FIG. 2), and furthermore, an optical sensor 11 for detecting the lightness of ambient light is provided as an environment sensor. In addition, peripheral circuits (a driving circuit (not shown) for driving the TFT 6 in the pixel array region 8, wiring (not shown) connected to the optical sensor 11 and the driving circuit, lead wiring (not shown) from the pixel array region 8, etc.) are also provided.

The TFT 6 formed in the pixel array region 8 and the optical sensor 11 formed in the peripheral region 9 are formed on the active matrix substrate 2 monolithically by almost the same process. That is, partial constituent members of the optical sensor 11 are formed simultaneously with partial constituent members of the TFT 6.

In the case of a display mode in which the display apparatus uses transmitted light, it is necessary that a backlight system 12 is provided on a reverse surface side of the active matrix substrate 2 in a housing 35. Needless to say, in the case of using liquid crystal utilizing a reflection display mode that utilizes the reflection of ambient light, and in the case of using a self-light emitting element such as an EL as a display medium, a backlight system is not required.

Furthermore, the optical sensor 11 has an object of detecting ambient light; therefore, when light of the backlight system 12 is incident upon the optical sensor 11, there arises a problem that the optical sensor 11 malfunctions. Thus, care should be taken so that the backlight system 12 is not placed on a lower side of an optical sensor placement portion of the active matrix substrate 2, or a light-shield member (not shown) such as an aluminum tape is provided on a reverse surface of the optical sensor placement portion of the active matrix substrate 2.

Figure 3:
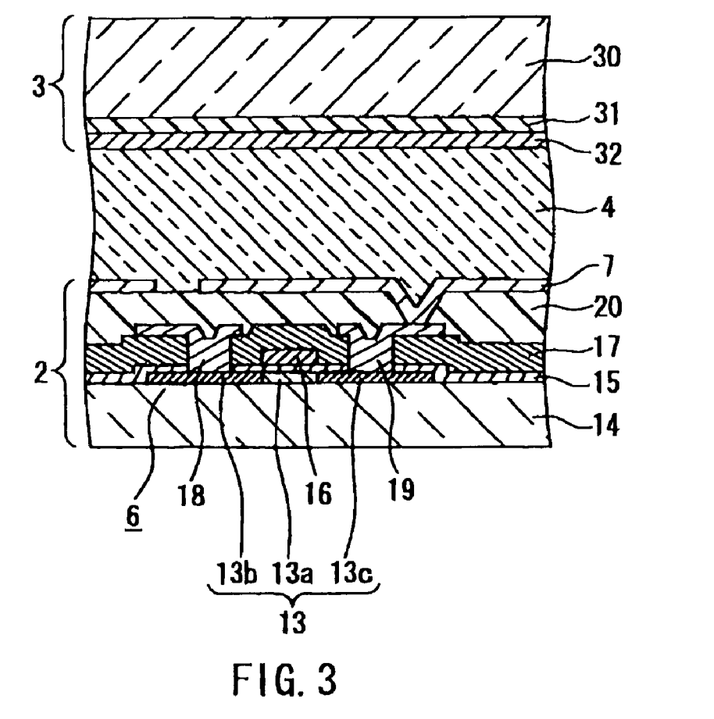
FIG. 3 is a cross-sectional view showing a configuration per pixel in a pixel array region (display region) of the electronic device according to First Embodiment.

Next, the detailed configuration of the display apparatus 1 of the present embodiment will be described with reference to FIGS. 1, 3, and 4. FIG. 3 is a cross-sectional configuration view per pixel of the pixel array region (display region) 8 in the display apparatus 1 shown in FIG. 1. The display medium (liquid crystal) 4 is interposed in a gap between the active matrix substrate 2 and the counter substrate 3. The active matrix substrate 2 is provided with the thin film transistor (TFT) 6 and the pixel electrode 7 for driving the display medium.

Hereinafter, the configurations of the TFT 6 using a polycrystalline Si film used in the present embodiment and the pixel 5 including the TFT 6 will be described with reference to FIGS. 1 to 3. The configuration of the TFT 6 used herein is called a "top gate structure" or a "forward stagger structure", and includes a gate electrode in an upper layer of the semiconductor film (polycrystalline Si film) 13 to be a channel.

Non-alkali barium borosilicate glass, aluminoborosilicate glass, or the like is used for the glass substrate 14 that is a base substrate. The TFT 6 includes a polycrystalline Si film 13 formed on the glass substrate 14, a gate insulation film 15 (a silicon oxide film, a silicon nitride film, etc.) formed so as to cover the polycrystalline Si film 13, a gate electrode 16 (Al, Mo, Ti, or an alloy thereof) formed on the gate insulation film, and a first interlayer insulation film 17 (a silicon oxide film, a silicon nitride film) formed so as to cover the gate electrode.

Herein, in the polycrystalline Si film 13, a region opposed to the gate electrode 16 via the gate insulation film 15 functions as a channel region 13a. Furthermore, regions of the polycrystalline Si film 13 other than the channel region are n$^+$ layers doped with impurities in a high concentration, which function as a source region 13b and a drain region 13c. Although not shown, in order to prevent the degradation in electrical characteristics caused by hot carriers, a lightly doped drain (LDD) doped with impurities in a low concentration is formed on a channel region side of the source region 13b and a channel region side of the drain region 13c.

A base coat film (for example, a silicon oxide film, a silicon nitride film, or the like can be used) may be provided on the surface (under the polycrystalline Si film 13) of the glass substrate. Furthermore, the polycrystalline Si film 13 can be obtained by crystallizing a semiconductor film (an amorphous Si film) having an amorphous configuration by heat treatment such as laser annealing, rapid thermal annealing (RTA), or the like.

A source electrode 18 (for example, Al, Mo, Ti, or an alloy thereof can be used) formed on the first interlayer insulation film 17 is electrically connected to the source region 13b of the polycrystalline Si film 13 via a contact hole passing through the first interlayer insulation film 17 and the gate insulation film 15. Similarly, a drain electrode 19 (for example, Al, Mo, Ti, or an alloy thereof can be used) formed on the first interlayer insulation film 17 is electrically connected to the drain region 13c of the polycrystalline Si film 13 via a contact hole passing through the first interlayer insulation film 17 and the gate insulation film 15.

Up to this point, the basic configuration of the TFT 6 used herein has been described. In the pixel array region (display region) 8, a second interlayer insulation film 20 is further formed so as to cover the TFT 6. Herein, the second interlayer insulation film 20 is required to play a role of flattening the unevenness of a lower layer as well as providing insulation between layers. Therefore, an organic film (for example, an organic insulation film made of acrylic, polyimide, or the like) capable of being formed by coating or printing is mainly used.

Furthermore, the pixel electrode 7 (for example, indium-tin-oxide (ITO), indium-zinc-oxide (IZO), Al, etc.) is formed in an upper layer of the second interlayer insulation film 20. The pixel electrode 7 is electrically connected to the drain electrode 19 via a contact hole formed in the second interlayer insulation film 20. It is preferable to use an organic insulation film having photosensitivity as the second interlayer insulation film 20, and a contact hole can be formed easily in the second interlayer insulation film 20 by exposure to light through a mask and development. Examples of the organic insulation film having photosensitivity include acrylic, polyimide, and benzo-cyclo-butene (BCB).

In FIG. 3, reference numeral 30 denotes a glass substrate that is a base substrate of the counter substrate 3, 31 denotes a color filter, and 32 denotes a counter electrode formed over the entire surface of the counter substrate 3.

Figure 4:
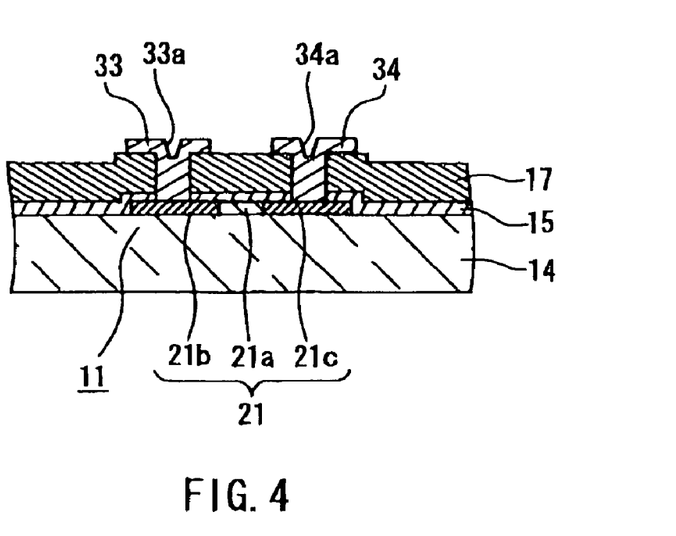
FIG. 4 is a cross-sectional view showing an example of a configuration of an optical sensor portion of the electronic device according to First Embodiment.

FIG. 4 is a cross-sectional configuration view of the optical sensor 11 formed in the peripheral region 9.

Hereinafter, the configuration of the optical sensor 11 will be described with reference to FIG. 4. The configuration of the optical sensor 11 used herein is called a "photodiode with a lateral structure", which includes a diode in which a PIN junction of a semiconductor is formed in a plane direction lateral direction) of a substrate.

In the optical sensor 11 shown in FIG. 4, a PIN diode of the polycrystalline Si film 21 is formed on the glass substrate 14 (a substrate common to the substrate on which TFTs are formed) to be a base substrate. The polycrystalline Si film 21 of the optical sensor 11 is formed simultaneously by the same process as that of the polycrystalline Si film 13 (see FIG. 3) of the TFT 6 in the pixel array region 8 (display region). Therefore, the polycrystalline Si film 13 and the polycrystalline Si film 21 have the same thickness.

The PIN junction is formed of a $p^+$ layer (region 21b) and an $n^+$ layer (region 21c) doped with impurities in a high concentration, and an i layer (region 21a) that is not doped with impurities. A $p^-$ layer and an $n^-$ layer doped in a low concentration can also be used alone or in combination.

Furthermore, the gate insulation film 15 (a silicon oxide film, a silicon nitride film, etc.) and the first interlayer insulation film 17 (a silicon oxide film or a silicon nitride film) are formed so as to cover the polycrystalline Si film 21 having a PIN junction. The gate insulation film 15 and the first interlayer insulation film 17 shown in FIG. 4 are the gate insulation film 15 of the TFT 6 and the first interlayer insulation film 17 in the pixel array region 8 (see FIG. 3), which extend to the peripheral region 9.

A p-side electrode 33 (for example, Al, Mo, Ti, or an alloy thereof can be used) formed on the first interlayer insulation film 17 is electrically connected to the $p^+$ region 21b of the polycrystalline Si film 21 via a contact hole passing through the first interlayer insulation film 17 and the gate insulation film 15. Similarly, an n-side electrode 34 (for example, Al, Mo, Ti, or an alloy thereof can be used) formed on the first interlayer insulation film 17 is electrically connected to the $n^+$ region 21c of the polycrystalline Si film 21 via a contact hole passing through the first interlayer insulation film 17 and the gate insulation film 15. In the p-side electrode 33 and the n-side electrode 34, a portion exposed to the surface of the first interlayer insulation film 17 is an electrode portion of the optical sensor 11. In the configuration shown in FIG. 4, concave portions 33a, 34a are formed in the respective top portions of the p-side electrode 33 and the n-side electrode 34. In the case where some film (for example, a protective film) is provided in an upper layer of the optical sensor 11, the concave portions 33a, 34a have an effect of enhancing the adhesion to the film, and may not be necessarily required. That is, the respective top portions of the p-side electrode 33 and the n-side electrode 34 may be flat.

The formation of contact holes in the first interlayer insulation film 17 and the gate insulation film 15 in the peripheral region 9 is performed simultaneously with and by the same process as that of the formation of contact holes in the first interlayer insulation film 17 and the gate insulation film 15 in the pixel array region 8. Furthermore, the formation of the p-side electrode 33 and the n-side electrode 34 is performed simultaneously with and by the same process as that of the formation of the source electrode 18 and the drain electrode 19 of the TFT 6.

Up to this point, the basic configuration of the optical sensor 11 has been described. The constituent members of the optical sensor 11 are basically the same as those of the TFT 6 in the above-mentioned pixel array region, and the production process thereof is also common. Thus, in the active matrix substrate 2, the TFT 6 in the pixel array region 8 and the optical sensor 11 in the peripheral region 9 are formed monolithically.

In the peripheral region 9, in addition to the above-mentioned optical sensor 11, peripheral circuits (a driving circuit (not shown) for driving the TFT 6 in the pixel array region 8, wiring 36 connected to the optical sensor 11 and the driving circuit, lead wiring (not shown) from the pixel array region 8, etc.) are also formed.

As shown in FIG. 1, in the electronic device according to the present embodiment, a UV-light blocking member 70 is placed so as to locally cover the upper layer of the optical sensor 11 in the peripheral region. As the UV-light blocking member 70, for example, a transparent acrylic plate having an effect of absorbing UV-light while transmitting visible light can be used. The UV absorptivity of the acrylic plate is preferably 50% or more, and more preferably 90% or more.

Figure 2:
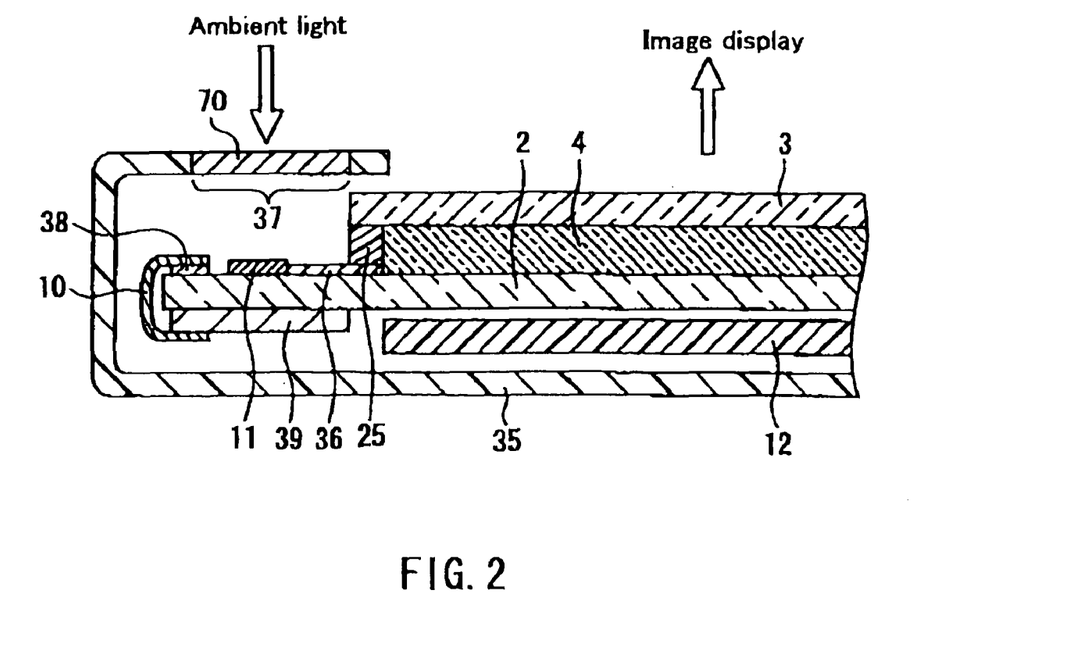
FIG. 2 is a cross-sectional view showing a state in which the display apparatus is incorporated in a housing in First Embodiment.

As shown in FIG. 2, the UV-light blocking member 70 is fitted in an opening portion 37 provided in an upper portion of the optical sensor 11 in the housing 35 of the display apparatus 1. The UV-light blocking member 70 may be stacked on the front or reverse surface of the housing 35 so as to cover the opening portion 37 instead of being fitted in the opening portion 37. Due to this configuration, ambient light reaches the optical sensor 11 through the UV-light blocking member 70. Thus, UV-light contained in ambient light can be prevented from reaching the optical sensor 11 by providing the UV-light blocking member 70 in an upper layer of the optical sensor 11. Consequently, the influence of UV-light with respect to the detection precision of the optical sensor 11 is suppressed, which enables the appropriate adjustment of a brightness in accordance with the lightness of visible light. Reference numeral 39 in FIG. 2 denotes a circuit substrate, and 25 denotes a sealing member.

Figure 5:
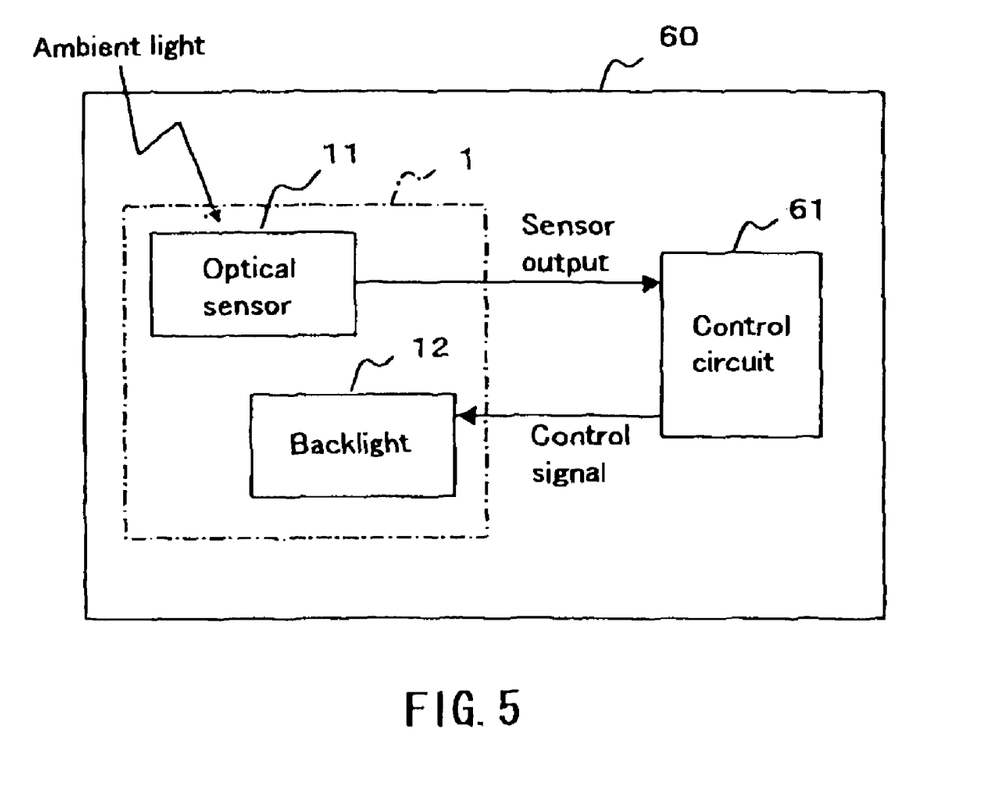
FIG. 5 is a block diagram showing a schematic configuration of the electronic device according to First Embodiment.

FIG. 5 is a block diagram showing a schematic configuration of an electronic device 60 according to the present embodiment having the display apparatus 1 according to the above configuration. As shown in FIG. 5, the electronic device 60 includes the display apparatus 1, and a control circuit 61 that controls the display brightness of the display apparatus 1 in accordance with the lightness information of ambient light detected by the optical sensor 11 of the display apparatus 1. In FIG. 5, the functional blocks in the display apparatus 1 and the electronic device 60 are abbreviated. The control circuit 61 may have a function of controlling any operation of the electronic device 60 in addition to the control of the display brightness. Furthermore, the electronic device 60 can have any functional blocks other than those shown in FIG. 5 depending upon the application thereof and the like.

The control circuit 61 controls the brightness of the display apparatus 1 by adjusting the brightness of the backlight system 12 in accordance with the lightness information (sensor output) detected by the optical sensor 11. For example, if the adjustment of a brightness (light control) is performed automatically so that the display brightness is increased in a light environment such as the outdoor, and the display brightness is decreased in a relatively dark environment such as the nighttime and the indoor, the reduction in power consumption and the increase in life of the display apparatus can be realized. In the case of using a semi-transmission display mode using both a transmission display mode and a reflection display mode, the brightness of a backlight system can be decreased or the backlight can be turned off in a light environment such as the outdoor, so that the reduction in power consumption and the increase in life of the display apparatus can be realized further. Since the display apparatus 1 is a liquid crystal display apparatus, the display brightness thereof can be adjusted by controlling the brightness of a backlight system. In the case of using a self-light emitting element such as an EL element as a display apparatus, the control circuit 61 is configured so as to control the emission brightness of the self-light emitting element.

Thus, by controlling the display brightness so as to obtain a necessary and sufficient brightness in accordance with the lightness of the circumstance, an electronic device that reduces power consumption and realizes an easy-to-see display can be provided. The electronic device of the present embodiment can satisfy both the satisfactory visibility and the reduction in power consumption with respect to the change in lightness of a use environment, so that it is particularly useful as a mobile device which is likely to be used outdoors and requires the driving of a battery. Specific examples of such a mobile device are not limited to the application of the present invention, and include, for example, an information terminal such as a mobile telephone and a PDA, a mobile game device, a portable music player, a digital camera, and a video camera.

Herein, although the configuration in which the control circuit 61 for controlling the display brightness of the display apparatus is provided outside of the display apparatus 1 has been illustrated, the control circuit may be provided as a part of the display apparatus 1.

In the present embodiment, an example in which the UV-light blocking member 70 is fitted in the opening portion 37 of the housing 35 of the display apparatus 1 has been described. However, in a housing (for example, a housing to be an outermost enclosure of the electronic device) present further on the outer side of the housing 35 of the display apparatus 1, the UV-light blocking member may be fitted in a portion covering the upper layer of the optical sensor 11.

Second Embodiment

Figure 6:
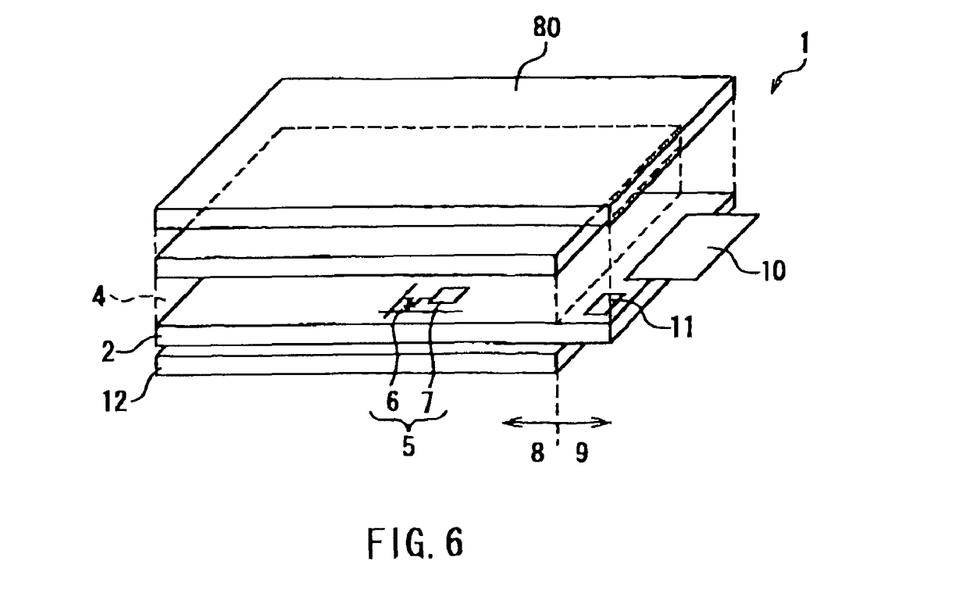
FIG. 6 is a perspective view showing an entire configuration of a display apparatus provided in an electronic device according to Second Embodiment.

An electronic device according to Second Embodiment will be described with reference to FIGS. 6 and 7. The same constituent members as those in First Embodiment are denoted with the same reference numerals as those used in First Embodiment, and the description thereof will be omitted.

Although the electronic device according to Second Embodiment has a UV-light blocking member in an upper layer of the optical sensor 11 in the same way as in First Embodiment, the configuration of the UV-light blocking member is different from that in First Embodiment. In the present embodiment, as shown in FIG. 6, a UV-light blocking member 80 having a substantially equal area to that of the active matrix substrate 2 is placed so as to cover both the pixel array region 8 and the peripheral region 9 in their entirety. As the UV-light blocking member 80, for example, a transparent acrylic plate having a UV-light absorbing effect can be used. The UV-light absorptivity of the acrylic plate is preferably 50% or more, and more preferably 90% or more.

Figure 7:
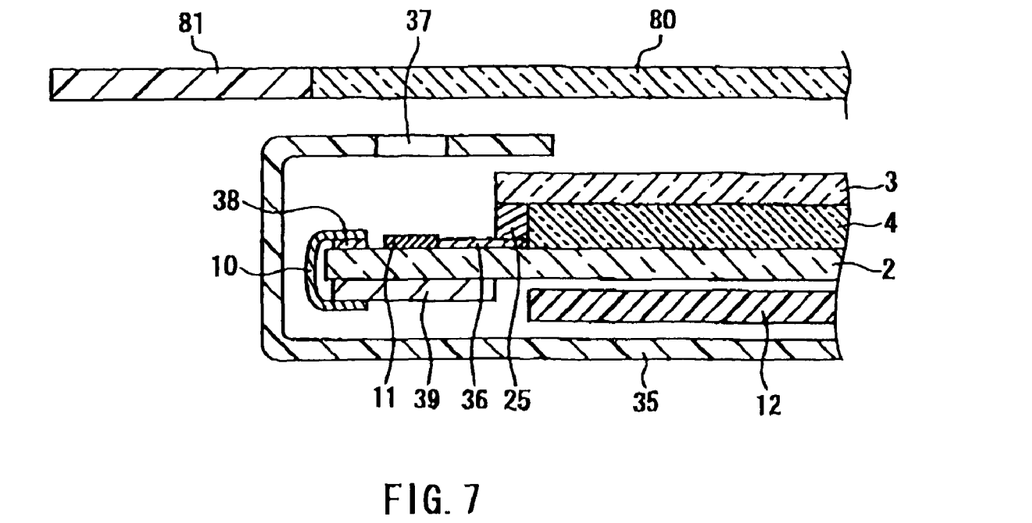
FIG. 7 is a cross-sectional view showing an example of a configuration of the electronic device according to Second Embodiment.

As shown in FIG. 7, the UV-light blocking member 80 is provided as a part of a housing 81 to be an outermost enclosure of the electronic device, and has both the functions of protecting the display apparatus 1 (in particular, the pixel array region 8 that is a display plane) and preventing the incidence of UV-light with respect to the optical sensor 11.

Thus, by providing the UV-light blocking member 80 in an upper layer of the optical sensor 11, the UV-light contained in ambient light can be prevented from reaching the optical sensor 11. Consequently, the influence of the UV-light on the detection precision of the optical sensor 11 is suppressed, which enables the appropriate adjustment of a brightness in accordance with the lightness of visible light.

Third Embodiment

The electronic device according to Third Embodiment of the present invention will be described with reference to FIG. 8. The same constituent members as those in each of the above-mentioned embodiments are denoted with the same reference numerals as those used in the embodiments, and the description thereof will be omitted.

The electronic device according to Third Embodiment is different from First and Second Embodiments in that the electronic device according to Third Embodiment has a touch panel on the surface of the display apparatus 1, and at least a part of the constituent members of the touch panel function as a UV-light blocking member.

Figure 8:
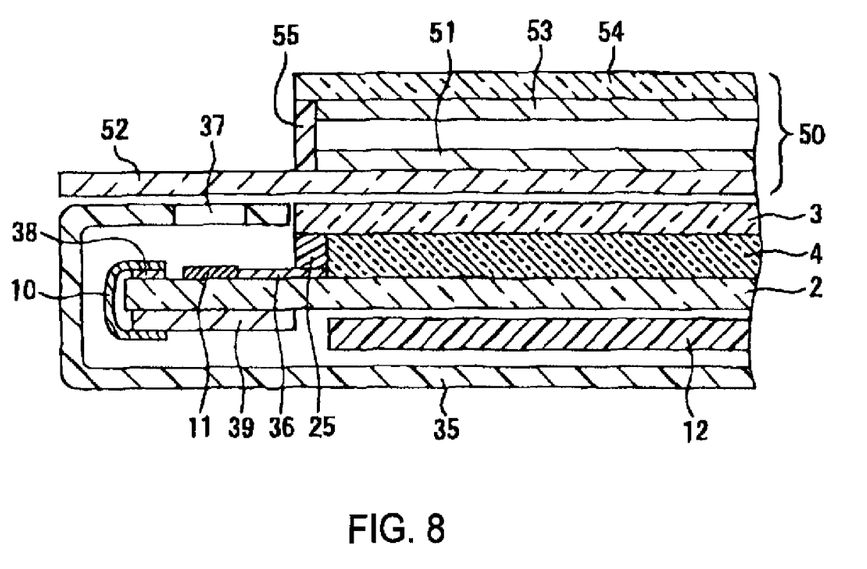
FIG. 8 is a cross-sectional view showing an example of a configuration of an electronic device according to Third Embodiment.

FIG. 8 is a cross-sectional view showing a configuration of the electronic device of the present embodiment. A touch panel 50 is stacked on the surface of the display apparatus 1. The touch panel 50 includes a support substrate 52 with a transparent electrode 51 formed thereon, and a flexible substrate 54 with a transparent electrode 53 formed thereon. The support substrate 52 and the flexible substrate 54 are bonded to each other with an adhesive 55 with a predetermined gap placed therebetween so that the transparent electrode 51 and the transparent electrode 53 are opposed to each other. The flexible substrate 54 has flexibility to such a degree that it is bent when being pushed. The touch panel 50 is configured so that, when the flexible substrate 54 is pressed with the finger, a pen, or the like, the pressed portion of the transparent electrode 53 comes into contact with the transparent electrode 51 of the support substrate 52, thereby detecting the coordinate of the pressed portion. Although FIG. 8 shows a configuration in which the touch panel 50 is stacked directly on the surface of the display apparatus 1, some member (for example, a shock absorbing material) may be provided between the touch panel 50 and the display apparatus 1.

The support substrate 52 is a transparent substrate covering the peripheral region 9 as well as the pixel array region 8, and is formed of, for example, an acrylic plate or polyethylene terephthalate (PET) having a UV-light absorbing effect. The UV-light absorptivity of the support substrate 52 is preferably 50% or more, and more preferably 90% or more.

Thus, the support substrate 52 of the touch panel 50 functions as a UV-light blocking member in an upper layer of the optical sensor 11 provided in the peripheral region 9, whereby the UV-light contained in ambient light can be prevented from reaching the optical sensor 11. Consequently, the influence of the UV-light on the detection precision of the optical sensor 11 is suppressed, which enables the appropriate adjustment of a brightness in accordance with the lightness of visible light.

In the present embodiment, although a pressure-sensitive touch panel has been illustrated, the touch panel applicable to the present invention is not limited to the pressure-sensitive one. Furthermore, in the present embodiment, although an example has been described in which the support substrate closest to the display apparatus 1 extends to the peripheral region 9, and functions as a UV-light blocking member, the constituent members other than the support substrate in the touch panel may extend to the peripheral region 9 and function as a UV-light blocking member.

Fourth Embodiment

An electronic device according to Fourth Embodiment will be described with reference to FIGS. 9 and 10. The same constituent members as those in each of the above-mentioned embodiments are denoted with the same reference numerals as those in the embodiments, and the description thereof will be omitted.

The electronic device of the present embodiment is a modified example of the electronic devices according to First to Third Embodiments, and includes a layer protecting the optical sensor 11 in an upper layer of the optical sensor 11 in the electronic devices in First to Third Embodiments. Thus, herein, only the peripheral configuration of the optical sensor 11 will be described.

In the electronic device of the present embodiment, the second interlayer insulation film 20 in the pixel array region 8 extends to the upper layer of the optical sensor 11 in the peripheral region 9. In other words, as shown in FIG. 9, a transparent insulation layer 20a made of the same material as that of the second interlayer insulation film 20 in the pixel array region 8 is provided in the upper layer of the optical sensor 11. Herein, it is preferred that the transparent insulation layer 20a is formed by the same process as that of the second interlayer insulation film 20. This is because the increase in the number of steps can be suppressed, and an electronic device can be supplied at a low cost.

The second interlayer insulation film 20 plays a role of electrically insulating the layer in which the TFT 6 is formed from the layer in which the pixel electrode 7 is formed and enhancing the flatness of the surface of the pixel electrode 7 in the pixel array region 8. On the other hand, the transparent insulation layer 20a plays a role of protecting the optical sensor 11 and the electrodes 33, 34 of the optical sensor 11 from outside air in the peripheral region 9.

The second interlayer insulation film 20 and the transparent insulation layer 20a are formed of an organic film having photosensitivity made of acrylic resin or the like. The organic film contains a photosensitive group absorbing UV-light so as to be patterned by exposure to UV-light, and is made of a material that is likely to effect a polymerization reaction or a collapse reaction of a polymer by exposure to UV-light. Therefore, the organic film has properties of being likely to absorb UV-light and being likely to be degraded (clouded or colored), compared with an ordinary resin material. When the organic film is degraded (clouded or colored), the light transmittance thereof decreases. Therefore, there arises a problem that the sensitivity of a sensor is degraded.

However, the electronic device according to the present embodiment has an advantage in that the transparent insulation layer 20a is not degraded due to UV-light since the upper layer of the optical sensor 11 is covered with a UV-light blocking member, as described in First to Third Embodiments. Therefore, light sensing with high precision can be performed while the optical sensor 11 is being protected from outside air by the transparent insulation layer 20a, which can also prevent the malfunction of peripheral circuits.

Figure 9:
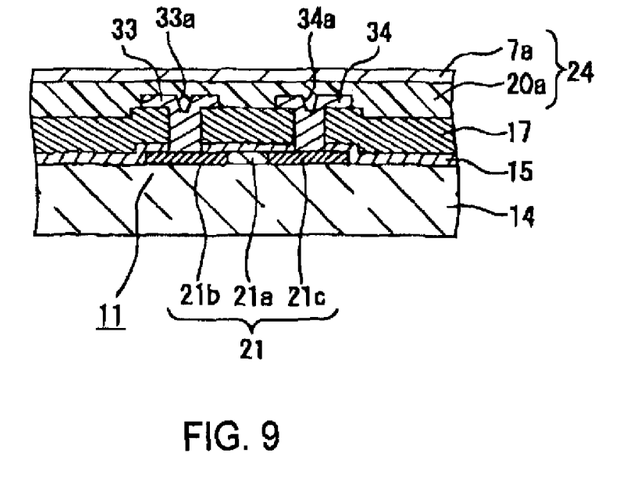
FIG. 9 is a cross-sectional view showing an example of a configuration of an optical sensor portion of an electronic device according to Fourth Embodiment.

Although not necessary, as shown in FIG. 9, it is preferred that the electronic device includes a transparent conductive layer 7a, which is made of the same material as that of the pixel electrode 7 and is connected to a predetermined fixed potential, in an upper layer of the transparent insulation layer 20a. It is preferred that the transparent conductive layer 7a is formed by the same process as that of the pixel electrode. This is because the increase in the number of steps can be suppressed, and an electronic device can be supplied at a low cost. Thus, the transparent conductive layer 7a is not limited to the above, and can be formed, for example, using a conductive oxide film made of ITO, IZO, ZnO, $SnO_2$, or the like, or a coating-type electrode material in which these fine particles are dispersed. Furthermore, a metal thin film (for example, a half mirror) can also be used as the transparent conductive layer 7a.

The pixel electrode 7 may be patterned in the pixel array region 8 so that the pixel electrode 7 in the pixel array region 8 and the transparent conductive layer 7a in the peripheral region 9 are simultaneously insulated electrically, and the transparent conductive layer 7a in the peripheral region 9 is connected to a fixed potential (e.g., 0 V). By doing so, the transparent conductive layer 7a plays a role of an electromagnetic shield with respect to the optical sensor 11 covered with the transparent insulation layer 20a. Consequently, the resistance to electromagnetic noise of the optical sensor 11, and an S/N ratio are enhanced, whereby light sensing with higher precision can be performed, which can also prevent the malfunction of peripheral circuits.

In the configuration shown in FIG. 9, the concave portions 33a, 34a are formed in the respective top portions of the p-side electrode 33 and the n-side electrode 34. The concave portions 33a, 34a have an effect of enhancing the adhesion to the transparent insulation layer 20a, and may not be necessarily required.

As described above, in addition to the features of First to Third Embodiments, the display apparatus 1 of the present embodiment has the following main features: the transparent insulation layer 20a made of the same material as that of the second interlayer insulation film 20 in the pixel array region 8 is also formed in the upper layer of the optical sensor 11 in the peripheral region 9; the transparent conductive layer 7a made of the same material as that of the pixel electrode 7 is formed in the upper layer of the transparent insulation layer 20a in the peripheral region 9; the transparent conductive layer 7a is electrically insulated from the pixel electrode 7 in the pixel array region 8; and the transparent conductive layer 7a in the peripheral region 9 is connected to a fixed potential, etc. These features in the present embodiment are not necessary required, and do not limit the present embodiment.

As described above, the display apparatus of the present embodiment further includes the transparent conductive layer 7a having an effect of attenuating the transmittance of UV-light in the upper layer of the transparent insulation layer 20a provided on the optical sensor 11. Therefore, the change in color of the transparent insulation layer 20a caused by UV-light can be alleviated (or eliminated) even if ambient light contains UV-light. Furthermore, the transparent conductive layer 7a is electrically insulated from the pixel electrode 7 in the pixel array region 8, and is connected to a fixed potential, thereby functioning as an electromagnetic shield. Thus, the influence of electromagnetic wave noise on the optical sensor 11 is alleviated, and the change in lightness of ambient light can be detected stably with high precision and exactness over a long period of time. Furthermore, as in the conventional example, in the case where the upper layer of the optical sensor is protected by only the second interlayer insulation film, it is necessary to design the optical sensor with excessive specs, in expectation of the degradation (decrease in a transmittance) in the second interlayer insulation film caused by UV-light. However, in the present embodiment, it is not necessary to consider the decrease in a transmittance of the second interlayer insulation film 20, whereby the optical sensor 11 can be appropriately designed. Therefore, the optical sensor 11 can be reduced in size compared with the conventional example. Consequently, the area of the peripheral region 9 in which the optical sensor 11 is placed can be minimized, which contributes to narrowing of the frame of the display apparatus. Furthermore, it is not necessary to allow the housing to have an electromagnetic shied effect, when the display apparatus is mounted on the electronic device, whereby the entire electronic device can be miniaturized.

Up to this point, although some embodiments have been described, these embodiments are not limiting. For example, in each of the above embodiments, although an example has been described in which the TFT 6 and the optical sensor 11 are formed using a polycrystalline Si film, both of them can also be formed using an amorphous Si film. Furthermore, a TFT with a bottom gate structure (reverse stagger structure) may be used instead of a TFT with a top gate structure (forward stagger structure). Furthermore, other active elements such as a metal-insulator-metal (MIM) can also be used in place of the TFT 6.

Furthermore, as the optical sensor, a photodiode having a Schottky junction or an MIS-type junction can also be used in place of an optical sensor using a PIN junction. For example, a method for forming a TFT with a bottom gate structure (reverse stagger structure) using an amorphous Si film and a photodiode having an MIS-type junction monolithically on the same substrate is known, for example, as disclosed by JP 6(1994)-188400 A, and this method would be obvious to those skilled in the art. Therefore, the detailed description thereof will be omitted.

The present embodiment can be widely applied to a flat panel type display apparatus with an active element, and can be applied to various kinds of display apparatuses such as an EL display apparatus and an electrophoresis display apparatus, in addition to the liquid crystal display apparatus.

The present embodiment includes an optical sensor detecting the intensity of ambient light, and can be used as an electronic device capable of adjusting a display brightness.

The invention claimed is:

1. An electronic device including an active matrix substrate having a pixel array region in which a plurality of pixels are arranged and a display medium provided on the active matrix substrate, comprising:
   an optical sensor provided in a peripheral region present in a periphery of the pixel array region in the active matrix substrate of the display apparatus; and
   a UV-light blocking member that is provided in a portion covering the optical sensor, and that transmits visible light and absorbs UV-light, wherein
   the UV-light blocking member has a substantially equal area to that of the active matrix substrate and covers both said pixel array region and said peripheral region, the electronic device further comprising
   a touch panel stacked on the display apparatus, wherein
   the touch panel includes the UV-light blocking member, and
   the UV-light blocking member covers the pixel array region and the peripheral region, wherein
   said touch panel includes a substrate that covers the pixel array region and the peripheral region, and the substrate is the UV-light blocking member.

2. The electronic device according to claim 1, wherein the UV-light blocking member attenuates a transmittance of UV-light contained in ambient light to 50% or less.

3. The electronic device according to claim 1, wherein the UV-light blocking member is an acrylic plate.

4. The electronic device according to claim 1, wherein at least a part of a constituent member of the optical sensor is produced by the same process as that of a constituent member of the active element.

5. The electronic device according to claim 1, wherein the optical sensor is formed on a principal plane of the active matrix substrate monolithically.

6. The electronic device according to claim 1, wherein in the pixel array region of the active matrix substrate, a plurality of electrode wires, a plurality of active elements, an interlayer insulation film provided in an upper layer of the plurality of electrode wires and the plurality of active elements, and a plurality of pixel electrodes formed on the interlayer insulation film are provided, and
   a transparent insulation layer made of the same material as that of the interlayer insulation film in the pixel array region is provided in an upper layer of the optical sensor.

7. The electronic device according to claim 6, wherein the interlayer insulation film and the transparent insulation layer are formed by the same process.

8. The electronic device according to claim 6, further comprising
   a transparent conductive layer made of the same material as that of the pixel electrode in an upper layer of the transparent insulation layer, wherein
   the transparent conductive layer is insulated from the pixel electrode in the pixel array region, and is connected to a fixed potential.

9. The electronic device according to claim 8, wherein the pixel electrode and the transparent conductive layer are formed by the same process.

10. The electronic device according to claim 1, wherein the active element is a thin film transistor, and the optical sensor is a photodiode having a lateral structure.

11. The electronic device according to claim 1, further comprising
    a control circuit that controls a display brightness in accordance with lightness information of ambient light detected by the optical sensor.

* * * * *